(12) United States Patent
Chooi et al.

(10) Patent No.: US 6,566,260 B2
(45) Date of Patent: May 20, 2003

(54) NON-METALLIC BARRIER FORMATIONS FOR COPPER DAMASCENE TYPE INTERCONNECTS

(75) Inventors: Simon Chooi, Singapore (SG); Subhash Gupta, Singapore (SG); Mei-Sheng Zhou, Kent Vale (SG); Sangki Hong, Bakie Regency (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/925,822

(22) Filed: Aug. 10, 2001

(65) Prior Publication Data

US 2001/0055878 A1 Dec. 27, 2001

Related U.S. Application Data

(62) Division of application No. 09/512,379, filed on Feb. 25, 2000, now Pat. No. 6,284,657.

(51) Int. Cl.[7] ................................................ H01L 21/44
(52) U.S. Cl. .................... 438/687; 438/637; 438/638
(58) Field of Search ........................ 438/672–675, 438/637–641

(56) References Cited

U.S. PATENT DOCUMENTS

| | | | |
|---|---|---|---|
| 5,693,563 A | 12/1997 | Teong | |
| 5,741,626 A | 4/1998 | Jain et al. | 430/314 |
| 5,744,394 A | 4/1998 | Iguchi et al. | 438/276 |
| 5,834,845 A | 11/1998 | Stolmeijer | 257/752 |
| 5,904,565 A | 5/1999 | Nguyen et al. | 438/687 |
| 6,040,243 A | * 3/2000 | Li et al. | 438/687 |
| 6,103,616 A | * 8/2000 | Yu et al. | 438/622 |
| 6,310,300 B1 | * 10/2001 | Cooney et al. | 147/258 |

* cited by examiner

Primary Examiner—David Nelms
Assistant Examiner—D Le
(74) Attorney, Agent, or Firm—George O. Saile; Rosemary L. S. Pike

(57) ABSTRACT

A method for forming dual-damascene type conducting interconnects with non-metallic barriers that protect said interconnects from fluorine out-diffusion from surrounding low-k, fluorinated dielectric materials. One embodiment of the method is particularly suited for forming such interconnects in microelectronics fabrications of the sub 0.15 micron generation.

19 Claims, 5 Drawing Sheets

NON-METALLIC BARRIER FORMATIONS FOR COPPER DAMASCENE TYPE INTERCONNECTS

This is a division of patent application Ser. No. 09/512, 379, filing date Feb. 25, 2000 now U.S. Pat. No. 6,284,657, Non Metallic Barrier Formation For Copper Damascene Type Interconnects, assigned to the same assignee as the present invention.

BACKGROUND OF THE INVENTION

1. Field of the Invention

This invention relates generally to microelectronics fabrications and, in particular, to methods of forming conducting interconnect structures that are protected from diffusion of chemical species into and out of surrounding materials.

2. Description of the Related Art

As the structures comprising integrated microelectronic circuitry continue to decrease in size, the conducting interconnects between them decrease in size as well. Smaller conducting interconnects must be composed of materials with higher conductivity and greater mechanical integrity, which presently favors the use of copper (Cu), with twice the conductivity of aluminum and three times the conductivity of tungsten, as the material of choice. Unfortunately, copper has been found to contaminate many of the materials used in integrated circuit fabrications, so special care must be taken to keep it from migrating into surrounding regions.

Several methods have been developed to provide containment of copper deposited as conducting leads and interconnects. Chief among these is the prior formation of diffusion barriers and liner layers within the trenches and vias into which the copper is subsequently deposited. Copper inlays surrounded by layers of other metals and their compounds such as tungsten, tantalum, molybdenum and titanium nitride, are called copper damascene structures.

Although the damascene process is an important step forward in forming viable copper interconnects, it does have problems associated with it which must be addressed. The barrier layer may itself be subject to degradation from surrounding materials. The barrier layer may not adhere well to the copper or to the surrounding material. The barrier layer may adversely affect the contact between the interconnect and other conducting layers. The barrier layer may be difficult to fabricate with the requisite thinness in small trenches and vias. With regard to the affect of surrounding materials on the barrier layer, it should be pointed out that fluorinated materials such as amorphous fluorinated carbon, PTFE, fluorinated polyimide and fluorinated silicon dioxide are presently being used as interlayer dielectrics because their low dielectric constants (low-k) tend to reduce parasitic capacitance between neighboring conducting lines and vias. When fluorinated materials are subjected to high temperature processing (above 300° C.), which is quite common in the complex fabrication schemes of integrated microelectronic circuitry, the fluorine tends to out-diffuse into previously deposited metallic barrier layers and form metallic fluoride compounds (eg., fluorine diffusing into tantalum forms tantalum fluoride, TaF). These compounds degrade the adhesion and integrity of the metallic layers and lead to their delamination.

Several of the aforementioned problems have been addressed by recent inventions. Nguyen et al (U.S. Pat. No. 5,904,565) teach a damascene process which allows a direct copper to copper connection between vias on different but contiguous levels of an integrated circuit. Their method involves removal of the bottom portion of the barrier layer with an anisotropic etch, so that the copper inlay is put into direct contact with the upper portion of the copper inlay on the level below it. Teong (U.S. Pat. No. 5,693,563) teaches an alternative method for solving the same double level contact problem, wherein two barrier layers are used to enhance the connection properties. Iguchi et al (U.S. Pat. No. 5,744,394) teach a method for interconnecting a series of transistors in an integrated circuit fabrication wherein the interconnection layer is connected to the transistors through a barrier layer which can be formed of any one of a number of metals or their compounds. Stolmeijer (U.S. Pat. No. 5,834,845) teaches a method for fabricating a multilevel interconnect structure composed of similar patterned metal layers as building blocks. These blocks are then connected by tungsten or aluminum plugs surrounded by titanium (Ti) or titanium nitride (TiN) barrier layers. Jain et al teach a method of improving the fabrication process of dual damascene structures by coating the devices with an anti-reflective material. This coating then enhances the photolithography process and also acts a a barrier layer for the copper interconnects.

Although each of the above cited inventions teach applications and improvements of the damascene process, they fail to address certain specific difficulties associated with the intrinsic nature of the process. In its various embodiments, the present invention differs from those cited above by addressing the following issues: the degradation of metallic barrier layers by the out-diffusion of fluorine from fluorinated dielectrics into those layers, the difficulty of using metallic barrier layers to conformally line trenches and vias of dimension less than 0.15 microns and the use of a novel class of non-conducting barrier layers to improve the adhesion of metallic barrier layers and copper inlays to trench and via sidewalls when the dimensions of these formations are less than 0.15 microns.

SUMMARY OF THE INVENTION

A first object of this invention is to provide a method for preventing the out-diffusion of fluorine from fluorinated dielectric materials into the metallic barrier layers such as those that characterize damascene interconnects.

A second object of this invention is to provide a method for preventing the out-diffusion of fluorine from fluorinated dielectric materials directly into conducting materials that may fill trenches and vias not lined with metallic barrier layers.

A third object of this invention is to provide a method for preventing conducting materials, such as copper, deposited in trenches and vias, from diffusing into surrounding dielectric materials.

A fourth object of this invention is to provide a method for preventing conducting materials, such as copper, sputtered onto the sidewalls of trenches and vias during etching, from diffusing into surrounding dielectric materials.

A fifth object of this invention is to provide a method of conformally lining trenches and vias whose aspect ratios are continually increasing with each technology generation, thus allowing the continued use and benefits of copper interconnects for devices of the 0.15 micron generation and beyond.

A sixth object of this invention is to provide a method for forming a lining layer whose low-k dielectric properties help to reduce the problems associated with parasitic capacitance between conducting interconnects and other neighboring structures.

A seventh object of this invention is to provide a method for forming a liner layer with improved adhesion properties between conductors and porous dielectrics.

An eighth object of this invention is to provide a method for forming a chemically inert spacer layer that protects surrounding materials from the effects of etches and post etch solvent stripping processes.

In one embodiment of the present invention these objects will be achieved by the chemical vapor deposition (CVD) or physical vapor deposition (PVD) of a non-metallic spacer layer interposed between the surrounding fluorinated dielectric material and a metallic barrier layer.

In another embodiment of the present invention particularly suited to trenches and vias whose minimum dimensions are less than 0.25 microns, these objects will be achieved by the plasma-enhanced chemical vapor deposition (PECVD) or physical vapor deposition (PVD) of a barrier layer composed of one of a class of low dielectric constant (low-k) carbon-based amorphous materials that can be deposited conformally to a thickness of 15 nanometers or less. For example, Teflon is such a low-k material ($1.9 \leq k \leq 2.1$) that adheres well to other dielectric materials. Its adhesion to copper can even be enhanced by depositing it over a prior layer of polyaniline or by modifying its surface to a hydrophobic condition. Such amorphous carbon-based materials will prevent the out-diffusion of copper from the conducting interconnect inlay and, therefore, obviate the need for an additional metallic barrier layer.

In yet another embodiment of the present invention, these objects will be achieved by a plasma treatment of the fluorinated dielectric surfaces to form, thereon, a "pseudo-carbon nitride" layer that is impermeable to both fluorine and copper out-diffusion and which may, therefore, obviate the need for an additional metallic barrier layer.

BRIEF DESCRIPTION OF THE FIGURES

FIG. 9 is a schematic cross-sectional view of two dual-damascene formations lined with metallic diffusion barriers. FIG. 9(a) depicts the shape of a present dual-damascene formation, while

DESCRIPTION OF THE PREFERRED EMBODIMENTS

In each of its preferred embodiments the present invention provides a method for forming lined conducing interconnects, such as copper dual-damascene type interconnects, in microelectronics fabrications. When formed in accordance with the methods taught in these preferred embodiments, the interconnects will protect the surrounding dielectric materials from copper out-diffusion and also protect the interconnect liner from the adverse affects of fluorine out-diffusion from fluorinated low-k dielectrics. In one of its preferred embodiments, the invention is particularly suited for creating interconnects of the reduced dimensions required in the sub-0.15 micron generation of microelectronics fabrications.

First Preferred Embodiment

A first preferred embodiment of the present invention teaches a method of forming a non-metallic barrier layer to fluorine out-diffusion that can be applied to the formation of conducting interconnects, such as copper damascene-type interconnects, in microelectronics fabrications. The method can be learned by referring to FIG. 1 through FIG. 8, in conjunction with the descriptions below.

Figure 1:
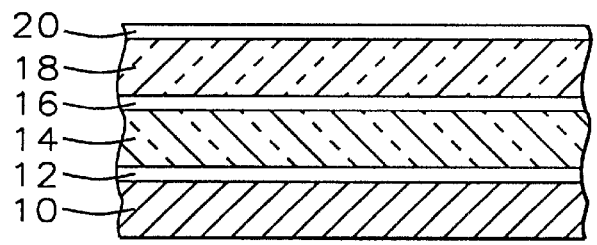
FIG. 1 is a schematic cross-sectional view of a multi-layer microelectronics fabrication prior to the formation of the trench and via of a dual-damascene type of interconnect. The interconnect will ultimately pass through the dielectric layers indicated and contact the lower conducting layer.
Figure 2:
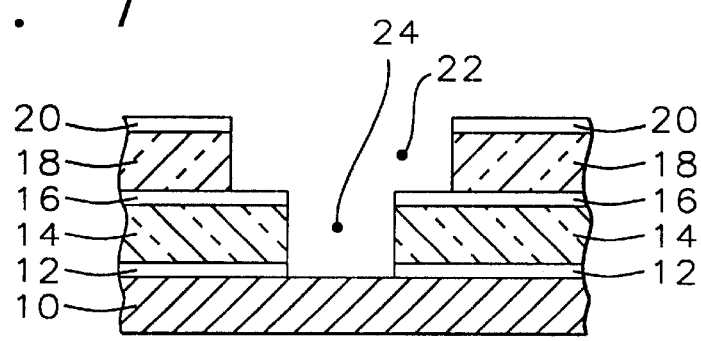
FIG. 2 is a schematic cross-sectional view of the trench and via formation of the dual-damascene type interconnect which has now been etched out by any one of several patterning and etch schemes, including via first, trench first or self-alignment (buried via).
Figure 3:
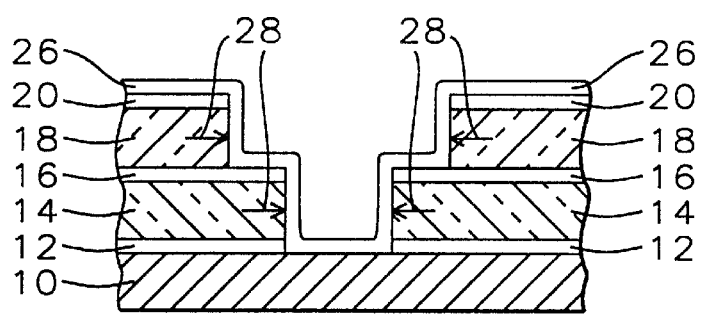
FIG. 3 is a schematic cross-sectional view of the dual-damascene trench and via formation with the metallic barrier layer having been formed directly over the exposed surfaces according to the method of the current art and not using the method of the present invention. The arrows point to areas where fluorine will tend to out-diffuse and degrade the properties of the metallic barrier layer so formed.

Referring now to FIG. 1, FIG. 2 and FIG. 3, there is shown a series of schematic diagrams illustrating the fabrication of a dual-damascene type of lined conducting interconnect in accordance with the methods of the current art, but not in accordance with the method of the present invention. These figures are used to indicate the advantages of the present invention.

FIG. 1 shows a schematic cross-sectional view of a microelectronics fabrication within which a dual-damascene interconnect is to be formed. The fabrication comprises a conducting layer (10), which is typically a copper (Cu) conducting layer, but which can also be a tungsten (W) layer or a combination of aluminum-copper (Al—Cu) alloy, titanium (Ti) and titanium nitride (TiN), all of thickness between 2000 angstroms and 15,000 angstroms, on which has been formed a passivating layer (12), which typically could be a layer of silicon nitride (SiN), of thickness between 500 angstroms and 5,000 angstroms, on which has been formed a first dielectric layer (14), which could be a layer of low-k fluorinated material such as, but not restricted to FSG, fluorinated polyimide, amorphous fluorocarbon, Parylene-F or PTFE(Teflon), of thickness between 1,000 angstroms and 10,000 angstroms, on which has been formed an etch-stop layer (16), which could be a layer of SiN or BLOK (from Applied Materials Corp.) or silicon oxide of thickness between 500 angstroms and 5,000 angstroms, on which has been formed a second layer of low-k fluorinated dielectric material (18), similar to the first dielectric layer (14) and on which has then been formed an optional capping layer (20), which could be a layer of SiN of thickness between 500 angstroms and 5,000 angstroms. It is to be noted that etch-stop layer (16) can become optional if the inter-level capacitance of the fabrication needs to be reduced.

FIG. 2 is a schematic cross-sectional view of the fabrication shown in FIG. 1 subsequent to the patterning and etching of a dual-damascene interconnect formation consisting of a trench (22) and a via (24), which is open to the Cu layer (10). The width of said trench is between 0.25 microns and 2.0 microns, the width of said via is between 0.15 microns and 0.40 microns. The etching process consists of plasma-assisted dry etching wherein the etching chemistry comprises one or more of the following: fluorocarbons (eg. $CF_4$, $C_4F_8$), hydrocarbons, fluorine substituted hydrocarbons (eg. $CHF_3$), fluorosulfurs (eg. $SF_6$), chlorine, hydrogen bromide, oxygen, nitrogen, argon, hydrogen and and carbon monoxide, wherein the choice of chemistries is tailored appropriately to the nature of the different layers.

FIG. 3 shows the interconnect fabrication of FIG. 2 having now been lined with a metallic barrier layer (26), which could be a layer of material such as tantalum nitride (TaN) or titanium nitride (TiN), formed to a thickness of between 50 angstroms and 3,000 angstroms by a process such as PVD (eg. deposition by sputtering, ion-metal plasma or hollow cathode magnetron) or CVD. The arrows (28) indicate the surfaces through which fluorine out-diffusion would occur as a result of subsequent high-temperature processing steps at temperatures exceeding 200° C. to 350° C. The out-diffusing fluorine reacts with the liner material to form more brittle and poorly adhering metallic fluorine compounds such as tantalum fluoride (TaF).

Figure 4:
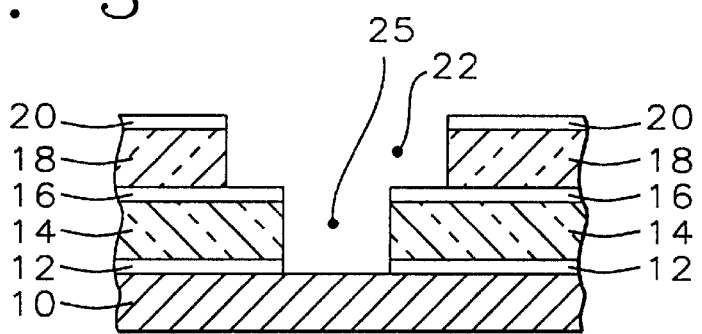
FIG. 4 is a schematic cross-sectional view of the etched out trench and via of a dual-damascene type interconnect done in accordance with the method of the present invention. Unlike the via illustrated in FIG. 2, the via in FIG. 4 extends only to the passivation layer over the conducting layer and does not penetrate it.

FIG. 4 shows a schematic cross-sectional view of the same microelectronics fabrication of FIG. 1 now being prepared for the formation of a dual-damascene interconnect according to the method of the present invention. A trench (22) and via (25) have been patterned and formed according to one of several methods known in the art, such as trench first, via first or a self-alignment (buried via) scheme. The trench is of width between 0.25 microns and 2.0 microns, the via is of width between 0.15 microns and 0.4 microns. In accordance with the method of the present invention, the via (25) extends only to the upper surface of the passivating layer (12).

Figure 5:
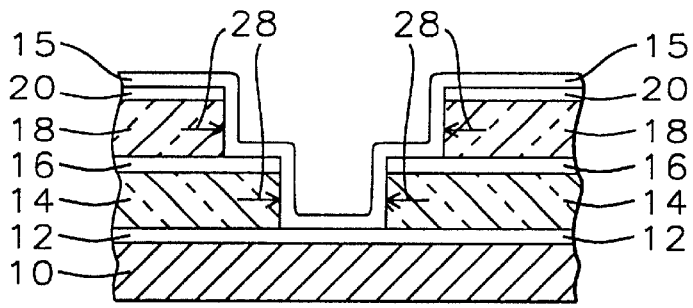
FIG. 5 is a schematic cross-sectional view of the trench and via formation shown in FIG. 4, now covered by a non-metallic layer deposited by a method of chemical vapor deposition (CVD) or physical vapor deposition (PVD).

FIG. 5 shows a schematic cross-sectional view of the same microelectronics fabrication of FIG. 4, wherein a non-metallic layer (15) has now been formed by a method of chemical vapor deposition (CVD) or physical vapor deposition (PVD), to a thickness of between 50 angstroms and 5,000 angstroms. The layer (15) conformally lines all exposed surfaces of the trench and via formation, including the exposed portion of the passivation layer (12) and a portion of the surrounding capping layer (20). The non-metallic layer (15) can be formed of a material such as silicon carbide, boron nitride, carbon nitride boron carbon nitride or boron carbide.

Figure 6:
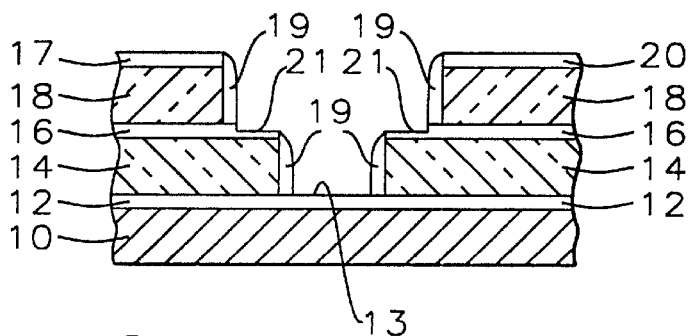
FIG. 6 is a schematic cross-sectional view of the fabrication in FIG. 5 with the non-metallic CVD or PVD layer removed from horizontal surfaces by a first anisotropic etch to leave barrier spacers on vertical surfaces.

FIG. 6 shows a schematic cross-sectional view of the same microelectronics fabrication of FIG. 5, subsequent to an anisotropic etch used to form a spacer layer (19) from the non-metallic layer (shown as (15) in FIG. 5). Said anisotropic etch consists of a plasma-assisted etch wherein the etching chemistry comprises one or more of the following: chlorine, boron trichloride, oxygen, hydrogen, nitrogen, forming gas (a mixture of nitrogen and hydrogen), fluorocarbon(s), fluorine-substituted hydrocarbon(s) and argon. As is seen in the figure, the etch has removed the non-metallic layer material (shown as (15) in FIG. 5) from the capping layer surface (17), partially removed said non-metallic layer material from the etch-stop layer surface (21) and partially removed said non-metallic layer material from the passivation layer surface (13), leaving said non-metallic layer material on the vertical surfaces of the trench and via formation (19) as shown.

Figure 7:
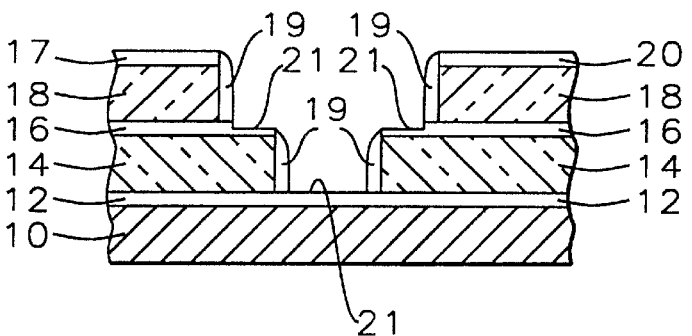
FIG. 7 is a schematic cross-sectional view of the fabrication in FIG. 6 subsequent to a second anisotropic etch to remove the passivation layer and expose the conducting layer.

FIG. 7 is a schematic cross-sectional view of the same microelectronics fabrication of FIG. 6, subsequent to a further etching which removes (at (21)) the passivation layer (12) from the conducting layer (10) beneath it. The etching process consists of plasma-assisted etching wherein the etching chemistry comprises one or more of the following: fluorocarbons (eg. $CF_4$, $C_4F_8$), hydrocarbons, fluorine substituted hydrocarbons (eg. $CHF_3$), oxygen, nitrogen, argon, and hydrogen. Note that during the etching process there is some degree of penetration into the conducting layer (21). During this process, the barrier layer now also acts as a protective layer to prevent diffusion of the sputtered conductor and its oxides into the surrounding dielectric, which is particularly important if the conductor is copper.

Figure 8:
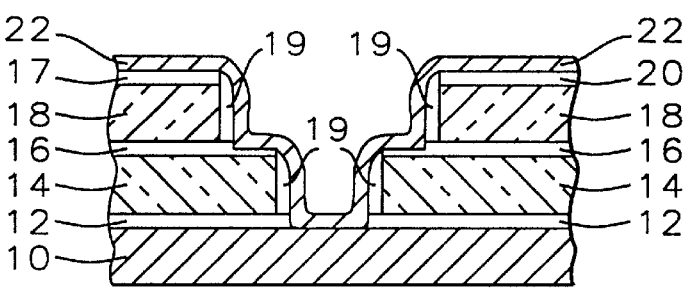
FIG. 8 is a schematic cross-sectional view showing the formation of a metallic barrier layer over the fabrication of FIG. 7. The structure of this fabrication, done in accordance with the method of the present invention, is to be contrasted to the fabrication in FIG. 3, which is done in accordance with the method of the current art and not in accordance with the method of the present invention.

FIG. 8 is a schematic cross-sectional view of the same microelectronics fabrication of FIG. 7, subsequent to the wet or dry cleaning of the sputtered conductor (not shown) and the formation of a metallic barrier layer (22), which comprises a layer of, but is not restricted to, TaN, TiN, WN, or tantalum or metal-silicon-nitride, of thickness between 50 angstroms and 2,000 angstroms. The fabrication is now ready for the insertion of a conducting inlay, typically a copper inlay formed by the deposition of copper over all surfaces of said trench and via formation (not shown).

Comparison of the fabrication illustrated in FIG. 8 to that illustrated in FIG. 3 shows the inherent advantages of the spacer layer, formed in accordance with the method of the present invention, in preventing the out-diffusion of fluorine into the metallic barrier layer (22).

Second Preferred Embodiment

A second preferred embodiment of the present invention teaches a method of forming a non-metallic barrier layer to copper diffusion into the dielectrics that can be applied to conducting interconnects, such as copper damascene-type interconnects, in the 0.15 micron and beyond generation of microelectronics fabrications. The method can be learned by referring to FIG. 9 through FIG. 14, in conjunction with the descriptions below.

Figure 9A:
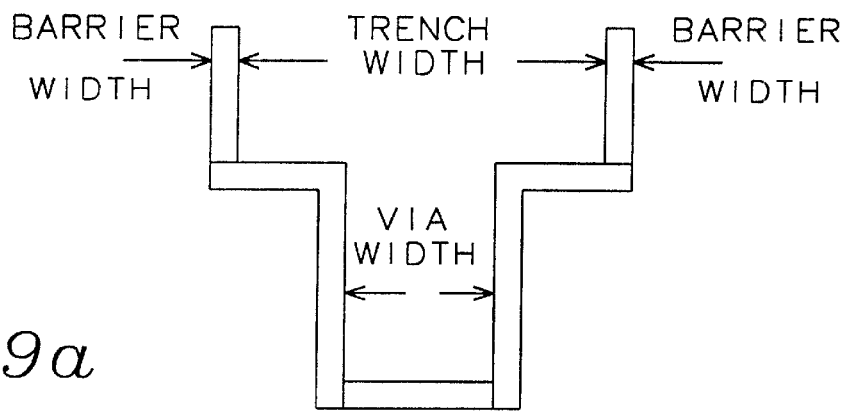

FIG. 9 is an illustrative schematic diagram, showing the liner shape of a typical dual-damascene trench and via formation. In FIG. 9(a) is shown the outline of such a formation as it would be found in the present generation of microelectronics fabrications. The width of the trench in this formation is between 0.25 microns and 2.0 microns, the width of the via is between 0.2 microns and 0.4 microns and the thickness of the barrier deposition is between 50 angstroms and 2000 angstroms.

Figure 9B:
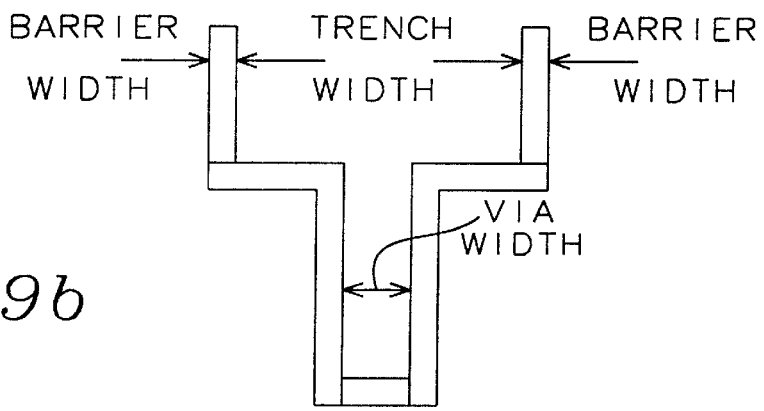
FIG. 9(b) depicts the reduced aspect of such a formation when applied to the 0.15 micron and beyond generation of microelectronics devices.

In FIG. 9(b) is shown a comparable formation as it would be found in the 0.15 micron and beyond generation of fabrications using metallic barrier depositions and not done according to the method of the present invention. The illustration is solely for the purposes of indicating that the reduced aspect of the trench and via in the 0.15 micron and beyond generation would, in turn, require a thicker barrier deposition, thereby placing more stringent requirements on the physical properties of the conducting inlays required (eg. to prevent the formation of voids). In this fabrication, the width of the trench is between 0.15 microns and 1.5 microns, the width of the via is between 0.05 microns and 0.3 microns and the thickness of the metallic barrier deposition would normally be between 100 angstroms and 2000 angstroms, which is an increase in thickness over the fabrication in FIG. 9(a).

Figure 10:
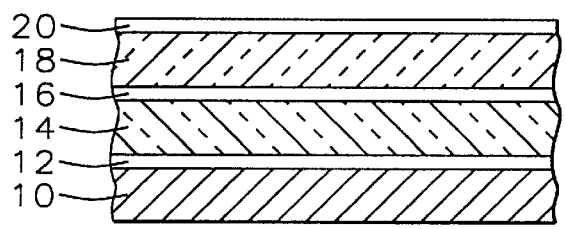
FIG. 10 is a schematic cross-sectional view of a multi-layer microelectronics fabrication of the 0.15 micron and beyond generation of microelectronics devices within which a dual-damascene type interconnect is to be formed.

FIG. 10 is a schematic cross-sectional view of a microelectronics fabrication, including a microelectronics fabrication of the below 0.15 micron device generation, within which a dual-damascene interconnect is to be formed. The fabrication comprises a conducting layer (10), which is typically a copper (Cu) conducting layer or a composite stack comprising one or more of the following metals: titanium, tungsten, titanium nitride and aluminum-copper, of thickness between 2,000 angstroms and 15,000 angstroms on which has been formed a passivation layer (12), which could be a layer of silicon nitride (SiN) or BLOK (mfg. by Applied Materials Corp.), of thickness between 500 angstroms and 5,000 angstroms, on which has been formed a first dielectric layer (14), which could be a layer of $SiO_2$ or doped $SiO_2$ such as PSG or a layer of carbon-doped silicon oxide such as methylsilsequioxane or a layer of low dielectric constant (low-k) organic polymer such as FLARE (mfg. by Allied Signal Corp.), SILK (mfg. by Dow Chemical Corp.), or a layer of inorganic polymer such as hydrogen silsesquioxane or a layer comprising the porous entity of the aforementioned dielectric films, of thickness between 1,000 angstroms and 10,000 angstroms, on which has been formed an etch-stop layer (16), which could be a layer of silicon carbide, SiN, SiON, or BLOK (mfg. by Applied Materials Corp.), of thickness between 500 angstroms and 5,000 angstroms, on which has been formed a second layer of dielectric material (18), similar to the first layer and on which has been formed an optional capping layer (20), which could be a layer of SiN of thickness between 500 angstroms and 5,000 angstroms.

Figure 11:
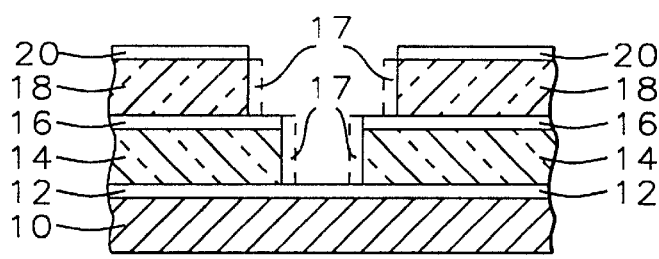
FIG. 11 illustrates the design parameters that must be considered in forming a dual-damascene type interconnect in a 0.15 micron and beyond generation of microelectronic fabrications such as is illustrated in FIG. 10. The figure also is a schematic cross-sectional view of the patterning and etching of the dual-damascene trench and via in accordance with the method of the present invention.

FIG. 11 is a schematic cross-sectional view of a trench and via formation that has been patterned and etched according to either a trench first, via first or self-aligned scheme. The etching process consists of plasma-assisted dry etching wherein the etching chemistry comprises one or more of the following: fluorocarbons (eg. $CF_4$, $C_4F_8$), hydrocarbons, fluorine substituted hydrocarbons (eg. $CHF_3$), fluorosulfurs (eg. $SF_6$), chlorine, hydrogen bromide, oxygen, nitrogen, argon, hydrogen and and carbon monoxide, wherein the choice of chemistries is tailored appropriately to the nature of the different layers. The dashed lines (17) indicate the design parameters for the final copper inlay, allowing for the thickness of the usual barrier layer. The solid vertical lines indicate the actual etched surface dimensions which are required to fulfill those design parameters. The trench is etched through the optional capping layer (20) and the second dielectric layer (18), stopping at the etch-stop layer (16). The via is etched through to the passivation layer (12).

Figure 12:
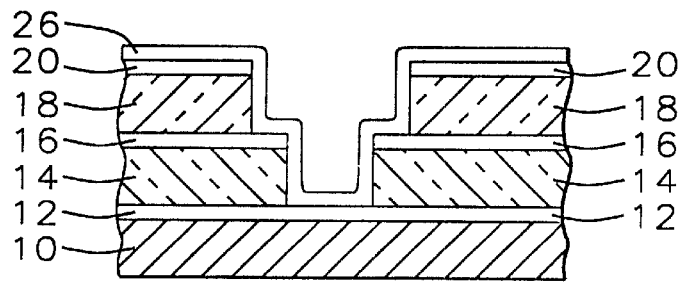
FIG. 12 is a schematic cross-sectional view of the fabrication in FIG. 11 subsequent to the formation of a non-conductive barrier of amorphous carbon-based materials.

FIG. 12 is a schematic cross-sectional view of the formation shown in FIG. 11 subsequent to the formation of a non-conductive barrier (26) by the plasma enhanced chemical vapor deposition (PECVD) or physical vapor deposition (PVD) of any of a class of carbon-based amorphous materials to a thickness of between 100 angstroms and 3,000 angstroms. Said carbon-based amorphous materials can consist entirely of carbon (eg. diamond) or can comprise carbon with one or more elements from the Periodic Table that are neither a metal or a conductor, examples including but not restricted to silicon carbide, carbon nitride, fluorocarbon polymers such as PTFE and Teflon, boron carbide and boron carbon nitride. The deposition conformally covers the walls of the trench and via as well as the upper surface of the capping layer. A further treatment in a furnace or an apparatus for rapid thermal annealing (RTA) between 200° C. and 450° C. to densify the carbon-based amorphous film may be effected if necessary. Note that the barrier properties and dielectric properties of carbon-based materials can be varied from that of diamond, whose dielectric constant is k=5.7, to that of Teflon, whose dielectric constant ranges between k=1.9 to 2.1, by varying the composition of the carbon or the material microstructure.

Figure 13:
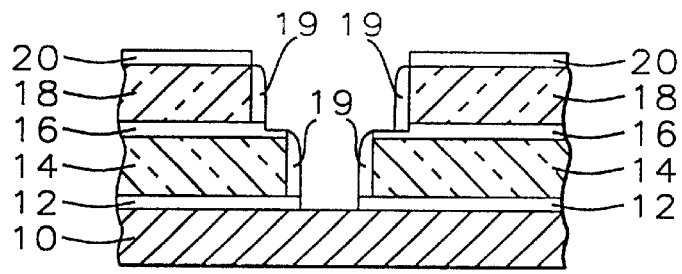
FIG. 13 is a schematic cross-sectional view of the fabrication in FIG. 12 subsequent to the application of an anisotropic etch to the non-metallic layer.

FIG. 13 shows a schematic cross-sectional view of the fabrication in FIG. 12 subsequent to an anisotropic etch of the carbon-based layer to form a spacer layer (19). Said anisotropic etch consists of a plasma-assisted etch wherein the etching chemistry comprises one or more of the following: chlorine, boron trichloride, oxygen, hydrogen, nitrogen, forming gas (a mixture of nitrogen and hydrogen), and fluorocarbon(s), The etch removes the non-metallic barrier layer from the optional capping layer (20) and partially from the etch-stop layer (16) and passivation layer (12). The carbon-based barrier layer remains on the vertical walls of the trench and via to form a spacer layer (19). The passivation layer (12) is subsequently etched to expose the underlying conductor layer (10). Said etch is a plasma assisted etch wherein the etching chemistry comprises one or more of the following: fluorocarbons, fluorine-substituted hydrocarbons, argon and nitrogen. There is some penetration by the etch into the conductor, hence the non-conductive barrier acts as a protective layer to prevent diffusion of the sputtered conductor and its oxides into the surrounding dielectrics.

Figure 14:
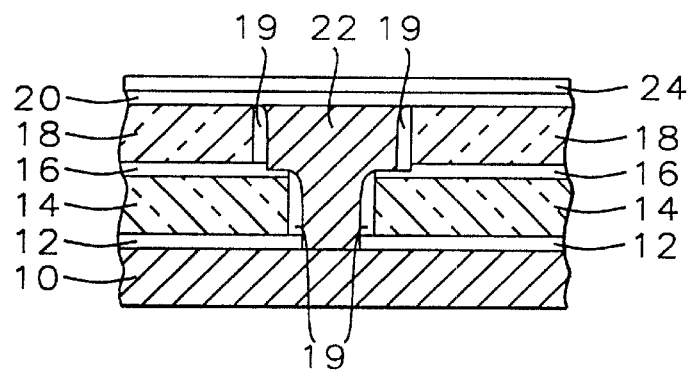
FIG. 14 is a schematic cross-sectional view of the fabrication in FIG. 13 wherein the trench and via have been filled with a copper inlay and covered with a passivation layer.

FIG. 14 is a schematic cross-sectional view of the completed interconnect, wherein a conducting inlay (27), such as a copper inlay, has been formed by a deposition of copper over all surfaces of said trench and via formation and then covered by a capping and passivation layer (28).

In accordance with the method and objects of this embodiment, the final dual-damascene interconnect for sub-0.15 micron microelectronics devices illustrated in FIG. 13 can now accept a copper inlay directly, as illustrated in FIG. 14, without the prior deposition of a metallic barrier layer, since the non-metallic barrier layer is able to prevent the diffusion of copper into the surrounding dielectrics.

Third Preferred Embodiment

A third preferred embodiment of the present invention teaches a novel plasma treatment of the exposed surfaces of the trench and via formations of a dual-damascene type conducting interconnect, thereby achieving a fluorine out-diffusion barrier without the need for an additional and space-consuming material layer. The method of this embodiment can be learned by referring to the succession of figures, FIG. 15 through FIG. 20, together with the description below.

Figure 15:
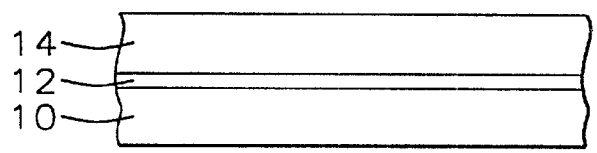
FIG. 15 is a schematic cross-sectional view of a multi-layer microelectronics fabrication prior to the formation of a dual-damascene type interconnect. The fabrication consists of a conducting substrate, such as a copper substrate, over which has been formed a first etch-stop and passivation layer and a first low-k dielectric layer.

Referring first to FIG. 15, there is shown a schematic cross-section of a microelectronics fabrication within which a dual-damascene type interconnect is to be formed. The fabrication comprises a conducting layer (10), which typically could be a copper layer of thickness between 2,000 angstroms and 15,000 angstroms, on which is formed a passivation layer (12), which typically could be a layer of SiN of thickness between 500 angstroms and 5,000 angstroms and on which is formed a first, low-k, fluorinated dielectric layer (14), which could be a layer of FSG, fluorinated polyimide, amorphous fluorocarbon, Parylene-F or PTFE (Teflon), formed by chemical vapor deposition (CVD) or spin coating to a thickness between 1,000 angstroms and 10,000 angstroms.

Figure 16:
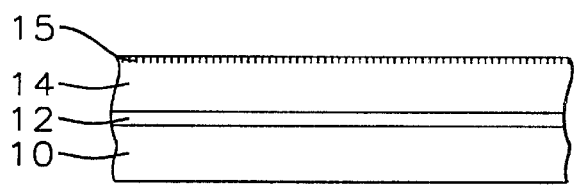
FIG. 16 is a schematic cross-sectional view of the same fabrication in FIG. 15, wherein the first low-k dielectric layer has been subjected to a nitrogen, hydrazine or $NH_3$ plasma treatment of its top surface.

FIG. 16 is a schematic cross-sectional view of the fabrication in FIG. 15 after a first plasma treatment of the upper surface of the first dielectric layer (14) with a nitrogen, hydrazine or $NH_3$ plasma. Said plasma is formed in a chamber wherein a plasma can be generated by an RF power source (13.56 MHz, 100 W–2,000 W) or a microwave source (2.45 GHz, 100 W–2,000 W) at a pressure between 1 mTorr and 50 mTorr. The plasma treatment forms a "pseudo-carbon nitride" layer (15), indicated as a shaded region, on that upper surface, by means of the reaction:

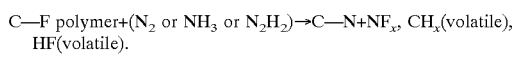

C—F polymer+($N_2$ or $NH_3$ or $N_2H_2$)→C—N+$NF_x$, $CH_x$(volatile), HF(volatile).

In the case of $NH_3$ or hydrazine plasma, it is expected that hydrogen may be incorporated into the "pseudo-carbon nitride" layer, possibly as a C—N—H type polymer or a a C—H—N type polymer or as a mixture of both.

Figure 17:
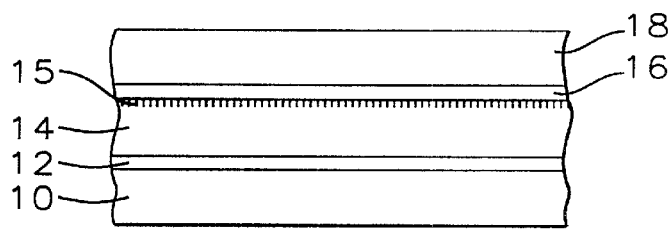
FIG. 17 is a schematic cross-sectional view of the fabrication of FIG. 16, on which a second etch-stop layer and a second low-k dielectric layer have been formed.

FIG. 17 is a schematic cross-sectional view of the fabrication in FIG. 16 subsequent to the formation of an etch-stop layer (16), which typically could be a layer of SiN, SiO or BLOK (mfg. by Applied Materials Corp.) deposited by CVD to a thickness of between 50 angstroms and 5,000 angstroms on the first dielectric layer, followed by the formation of a second low-k fluorinated dielectric layer (18), similar to the first such layer, on said etch-stop layer. The said etch-stop layer could become optional if the inter-level dielectric capacitance needs to be reduced.

Figure 18:
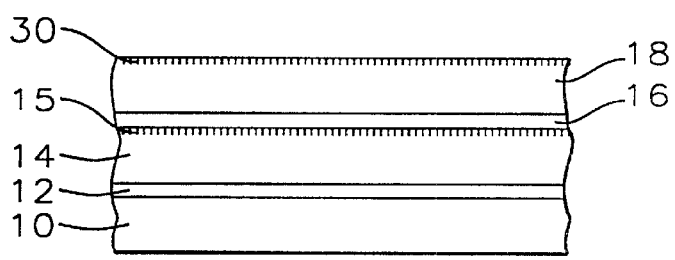
FIG. 18 is a schematic cross-sectional view of the fabrication in FIG. 17, subsequent to a nitrogen or $NH_3$ plasma treatment of the top surface of the second low-k dielectric layer.

FIG. 18 is a schematic cross-sectional view of the fabrication of FIG. 17 subsequent to a $N_2$, hydrazine or $NH_3$ plasma treatment (as described above) of the surface of the second low-k dielectric layer (18), to form a "pseudo-carbon nitride" layer (30), indicated as a shaded region on the upper surface of said dielectric layer.

Figure 19:
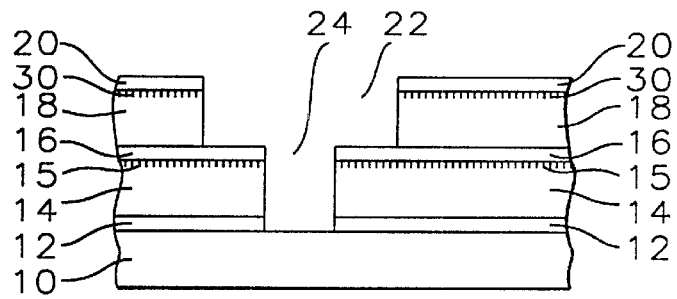
FIG. 19 is a schematic cross-sectional view of the fabrication in FIG. 18 upon which a capping layer has been formed and a trench and via have been patterned and etched.

FIG. 19 is a schematic cross-sectional view of the fabrication in FIG. 18, subsequent to the formation of an optional capping layer (20), which typically could be a layer of SiN of thickness between 500 angstroms and 5,000 angstroms and the patterning and etching of a dual-damascene trench (22) and via (24) formation. The passivation layer (12) has been removed by the etch, opening the via to the underlying conducting layer (10).

Figure 20:
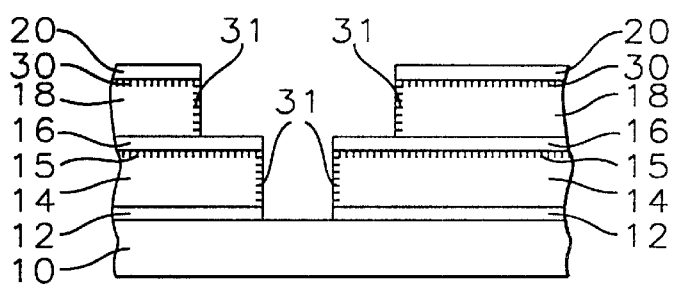
FIG. 20 is a schematic cross-sectional view of the completed trench and via formation.

Finally, FIG. 20 shows a schematic cross-sectional view of the dual-damascene formation in FIG. 19 subsequent to an isotropic and anisotropic $N_2$, $NH_3$, or hydrazine plasma treatment. A "pseudo-carbon nitride" layer has now been formed on the vertical exposed surfaces (31). In accord with the objects and methods of this embodiment, this final dual-damascene type formation can now accept a copper inlay directly, without prior formation of a metallic barrier layer, by the deposition of copper over all surfaces of said trench and via formation (not shown) or, as in the conventional art, first accept a metallic barrier layer followed by a copper inlay.

As is understood by a person skilled in the art, the preferred embodiments of the present invention are illustrative of the present invention rather than being limiting of the present invention. Revisions and modifications may be made to methods, processes, materials, structures and dimensions through which is formed a dual-damascene type of conducting interconnect that is impermeable to fluorine out-diffusion and copper out-diffusion and can, in one preferred embodiment, be used in the sub-0.15 micron generation of microelectronics fabrications in accord with the preferred embodiments of the present invention, while still providing a dual-damascene type of conducting interconnect that is impermeable to fluorine out-diffusion and copper out-diffusion and can, in one embodiment, be used in the sub-0.15 micron generation of microelectronics fabrications formed in accord with the present invention, as defined by the appended claims.

What is claimed is:

1. A method for forming a dual-damascene type conducting interconnect within a microelectronics fabrication, comprising:

providing a layered structure such as is used in a microelectronics fabrication, said structure comprising a conducting layer, on which has been formed a passivating layer, on which has been formed a first dielectric layer, on which has been formed an etch-stop layer, on which has been formed a second dielectric layer and on which has been formed a capping layer;

patterning and etching a trench and via structure that passes through said capping layer, said second dielectric layer, said etch-stop layer and said first dielectric layer and extending, thereby, to said passivating layer;

forming a non-metallic layer over all surfaces of said trench and via formation and said non-metallic layer conformally covers said surfaces;

etching away portions of said non-metallic layer to form a barrier "spacer" over the side-walls of said trench and via formation;

etching away the exposed portion of said passivation layer to expose the conducting layer;

depositing copper over all surfaces of said trench and via formation.

2. The method of claim 1 wherein the passivating layer is a silicon nitride (SiN) layer formed to a thickness between 500 and 5,000 angstroms.

3. The method of claim 1 wherein the first dielectric layer is a selected from the group consisting of undoped $SiO_2$, carbon doped silicon oxide, organic polymer and inorganic polymer, formed to a thickness of between 1,000 angstroms and 10,000 angstroms.

4. The method of claim 1 wherein the etch-stop layer is a layer of silicon carbide formed to a thickness between 500 angstroms and 5,000 angstroms.

5. The method of claim 1 wherein the etch-stop layer is a layer of SiON formed to a thickness between 500 angstroms and 5,000 angstroms.

6. The method of claim 1 wherein the second dielectric layer is a selected from the group consisting of undoped $SiO_2$, carbon doped silicon oxide, organic polymer and inorganic polymer, formed to a thickness of between 1,000 angstroms and 10,000 angstroms.

7. The method of claim 1 wherein the capping layer is a SiN layer formed to a thickness between 50 angstroms and 5,000 angstroms.

8. The method of claim 1 wherein the trench and via formation is patterned and etched using a trench first, via second method, said trench having a range of widths between 0.15 microns and 1.5 microns and said via having a range of widths between 0.05 microns and 0.3 microns.

9. The method of claim 8 wherein the etch is a plasma assisted etch whose chemistry comprises one or more of the gases selected from the group consisting of: fluorocarbon(s), fluorine-substituted hydrocarbon(s), hydrocarbon(s), fluorosulfur, chlorine, hydrogen bromide, oxygen, nitrogen, hydrogen, argon and carbon monoxide.

10. The method of claim 1 wherein the trench and via formation is patterned and etched using a via first, trench second method, said trench having a range of widths between between 0.15 microns and 1.5 microns and said via having a range of widths between 0.05 microns and 0.3 microns.

11. The method of claim 10 wherein the etch is a plasma assisted etch whose chemistry comprises one or more of the gases selected from the group consisting of: fluorocarbon(s), fluorine-substituted hydrocarbon(s), hydrocarbon(s), fluorosulfur, chlorine, hydrogen bromide, oxygen, nitrogen, hydrogen, argon and carbon monoxide.

12. The method of claim 1 wherein the trench and via formation is patterned and etched using a self alignment (buried via) method, said trench having a range of widths between 0.15 microns and 1.5 microns and said via having a range of widths between 0.05 microns and 0.3 microns.

13. The method of claim 12 wherein the etch is a plasma assisted etch whose chemistry comprises one or more of the gases selected from the group consisting of: fluorocarbon(s), fluorine-substituted hydrocarbon(s), hydrocarbon(s), fluorosulfur, chlorine, hydrogen bromide, oxygen, nitrogen, hydrogen, argon and carbon monoxide.

14. The method of claim 1 wherein the non-metallic layer is a layer of carbon-based amorphous materials of varying chemical composition, microstructure and physical properties formed by plasma-enhanced chemical vapor deposition (PECVD) or physical vapor deposition (PVD) to a thickness of between 100 angstroms and 3,000 angstroms.

15. The method of claim 14 wherein the chemical composition of the non-metallic carbon-based amorphous material is comprised solely of carbon.

16. The method of claim 14 wherein the chemical composition of the non-metallic carbon-based amorphous material comprises carbon and one or more elements that are not metals.

17. The method of claim 14 wherein the non-metallic carbon-based layer is a layer comprised of materials selected from the group consisting of: fluorocarbon polymer, silicon carbide, carbon nitride and boron carbide.

18. The method of claim 14 wherein the etch of the non-metallic carbon-based layer is an anisotropic etch using plasma assisted etching wherein the etching chemistry comprises one or more of the gases selected from the group consisting of: chlorine, boron trichloride, oxygen, hydrogen, nitrogen, forming gas (a mixture of hydrogen and nitrogen) and fluorocarbon(s).

19. The method of claim 1 wherein the etch of the passivation layer is a plasma assisted etch wherein the etching chemistry comprises one or more of the gases selected from the group consisting of: fluorocarbon(s), fluorine-substituted hydrocarbon(s), argon and nitrogen.

* * * * *